United States Patent
Rijavec

(10) Patent No.: US 6,653,954 B2
(45) Date of Patent: Nov. 25, 2003

(54) SYSTEM AND METHOD FOR EFFICIENT DATA COMPRESSION

(75) Inventor: Nenad Rijavec, Longmont, CO (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/079,179

(22) Filed: Feb. 19, 2002

(65) Prior Publication Data
US 2003/0090398 A1 May 15, 2003

Related U.S. Application Data

(63) Continuation-in-part of application No. 10/035,737, filed on Nov. 7, 2001.

(51) Int. Cl.7 .................................................. H03M 7/30
(52) U.S. Cl. ..................................... 341/63; 358/426.13
(58) Field of Search ....................... 341/63; 358/426.13, 358/426.14

(56) References Cited

U.S. PATENT DOCUMENTS 4,194,221 A    3/1980   Stoffel
5,469,161 A   11/1995   Bezek
5,542,031 A    7/1996   Douglass et al.
5,544,290 A    8/1996   Gentile
5,638,498 A    6/1997   Tyler et al.
6,188,333 B1   2/2001   Cooper
6,192,155 B1   2/2001   Fan

FOREIGN PATENT DOCUMENTS

WO    WO 96/41308    12/1996

OTHER PUBLICATIONS

U.S. patent application Ser. No. 09/305,258, Aschenbrenner, filed May 4, 1999.

Primary Examiner—Howard L. Williams
(74) Attorney, Agent, or Firm—Scott W. Reid; Jon A. Gibbons; Fleit, Kain, Gibbons, Gutman & Bongini P.L.

(57) ABSTRACT

A system and method that efficiently compresses data sets that contain one or more repetitive data values. Substitute symbols represent repeated data sequences in the compressed data output. Data sequences that terminate with one or more of a particular value are specially processed by storing their substitute symbols separately from the general substitute symbol dictionary so that they are able to be more efficiently accessed. Substitute symbols for contiguous data sequences that consist of those particular values are also stored separately. The preferred embodiment specially processes data sequences that contain data bytes equal to zero.

18 Claims, 8 Drawing Sheets

SYSTEM AND METHOD FOR EFFICIENT DATA COMPRESSION

CROSS REFERENCE TO RELATED APPLICATIONS

This non-provisional application is a continuation-in-part of the non-provisional patent application Ser. No. 10/035,737, entitled "System and Method for Efficient Tile Generation from Complex Raster Data" with inventor Nenad Rijavec filed Nov. 7, 2001 and commonly assigned herewith, which is hereby incorporated by reference in its entirety

BACKGROUND OF THE INVENTION

1. Field of the Invention

This invention generally relates to the field of data compression, and more particularly relates to a method and system for compressing data that contains a frequent occurrence of data elements that have the same value.

2. Description of Related Art

Data sets that contain various types of data, including data that defines images, executable programs and other data, are often very large. An example of a large data set is the raw data set describing an image, which is sometimes referred to as a raster data set. The size of a raster data set depends on the image size and resolution, as well as the colorspace used to represent the data and number of bits per color plane. The image size and resolution govern the number of pixels in the image, while the colorspace and the number of bits per color plane define the amount of data needed to describe each pixel.

A simple example is a bilevel image (i.e., where the image simply comprises a number of pixels which are each either on or off) which is a letter size image at a common print resolution of 600 dots per inch. Such an image contains over 33 million pixels that will require approximately 4 MBytes for uncompressed storage, given that each byte can describe eight pixels. Color images are commonly described using 8 or more bits per color. Techniques known as CIEL*a*b* and RGB colorspaces are used, respectively, with three color planes each, for device independent archival storage or for on screen image presentation. The CMYK (Cyan, Magenta, Yellow, Black) colorspace, which specifies four colorplanes, is often used for printing. Color images require between 24 and 32 bits per pixel, depending upon the inclusion of independent black color data, if the intensity of each color is represented with 8 bits per pixel. A letter size image with a resolution of 600 dots per inch requires approximately 96 MB of storage for a three-component colorspace and 128 MB for a four-component colorspace.

The size of a dataset impacts not only the storage of the data but also electronic communication of the dataset. The transmission of a dataset defining a highly detailed image that is to be transmitted to a high speed printer is a particularly difficult problem. Printers, which are capable of printing in excess of several hundred pages per minute, require that data for these images reach the printer with comparable speed. Data communication links are typically inadequate for the communication of the raw image data set to such high-speed printers. In order to communicate the image data to the high-speed printer, data compression is typically employed.

Compression algorithms that are used for image compression are able to be broadly classified into two categories, lossless compression and lossy compression. In a lossless algorithm, the decompressed image is an identical copy of the original image. As the name indicates, lossy algorithms introduce some data loss and the decompressed image is slightly different than the original image. The examples of commonly used lossless algorithms are ITU-TSS T6 Group 4 (for bilevel images) and Lempel-Ziv & Welch (LZW) for arbitrary data. The best-known lossy image compression algorithm is part of the Joint Photographic Experts Group (JPEG) standard.

The different types of compression algorithms are appropriate for different image types. Images may be classified into linework and continuous tone images (which may also be referred to as 'contone' images for the purposes of this specification). Linework images contain sharp edges and areas of high color contrast. Examples of linework images are rasterized text, pie charts and line drawings. Continuous tone images are distinguished from linework images by constantly varying color and a general lack (or relative unimportance) of sharp edges. Photographs are primary examples of continuous tone images.

Compression of a linework image via a lossy algorithm unacceptably degrades the decompressed image. Examples of unacceptable degradation of a linework image compressed with a lossy algorithm (e.g., the JPEG algorithm) are artifacts and blurring in areas which neighbor sharp edges within the linework image. On the other hand, compressing a continuous tone image via a lossless compression algorithm results in very little data compression (e.g., common reduction in data size is 10% for compression of a continuous tone image via the LZW algorithm). The use of a lossless compression algorithm on a continuous tone image may actually cause the data set to expand (i.e., the compressed data set is larger than the uncompressed data set). Conversely, the lossless data compression algorithms preserve the quality of a linework image and also tend to have good data compression performance. The quality degradation of a decompressed continuous tone image that was compressed via a lossy algorithm is often imperceptible. Image data compression becomes more efficient if the image data is distinguished between continuous tone image data and linework image data and the data is compressed via an algorithm suitable for the type of image. This phenomenon is used in many image data rasterizers that are used in color printing, which process linework and continuous tone differently. While multiple color planes can combine in various ways, the images being carried in the CMYK colorspace (which refers to the four color planes used to encode color data: Cyan, Magenta, Yellow and Black) for printing are almost invariably carried in the planar format, where each color plane of the image is compressed separately.

Linework image data is often encoded using a run length algorithm or a variant of the LZW algorithm. The run length algorithm encodes each scan line in the image separately, by recording the number of pixels that have the same color intensity value. Alternatively, a run end algorithm can be used where the position of the last pixel in a "run" of pixels with the same color is recorded instead of the length of each run. A number of run lengths and run end compression forms are currently used, such as the MRLE runlength format used to communicate linework image data to the Xeikon high speed color printheads. Since the runlength/run end compression format record the changes in color on each scan line, the resulting datasets tend to be quite efficient for linework data.

The runend/runlength format serves as the intermediate format for the MMR family of algorithms, such as ITU-TSS T6 Group4, and is therefore heavily used in processing of bilevel data.

The LZW algorithm compresses an arbitrary stream of data (i.e., its use is not necessarily restricted to image data). The LZW algorithm operates by building a dictionary of code words that each represents a sequence of bytes. The dictionary is implicit, which is to say that the dictionary is never explicitly embedded into the compressed data stream. The dictionary of the LZW algorithm is dynamically constructed by the compressed data stream decoder as the encoded data is processed. The code words of typical LZW encoding techniques are 9–12 bits long. When the dictionary is full (i.e., all of the code words have been used), a special code, i.e., the CLEARCODE, is encoded. Upon receipt of the CLEARCODE by an LZW decoder, the code word dictionary is erased and the algorithm restarts.

In general terms, the encoding process of the LZW algorithm operates by building data strings and maintaining a dictionary of code words to represent data strings that contain previously observed data patterns. These code words are used to replace subsequent occurrences of those data strings. The algorithm maintains a currently active string. The currently active string always has a corresponding code word in the dictionary. When the next character is processed from the un-encoded data input, a new string is considered, which comprises the currently active string with the current input character added to the end. If the dictionary already contains a code word describing the new string, that code word becomes the current string and the algorithm advances to the next character. Otherwise, the code word for the current string is output, a new code word is assigned to the "new" string, which comprises the "current string" and the "current input character," and the "current string" is reinitialized to the current input character. The processing of the algorithm then proceeds to the next character. The LZW algorithm uses the character itself as a code word to encode a single-character string. The main computational cost in the LZW compression is checking whether the "new" string has an existing code word. Modern LZW implementations use a hash table lookup to locate code words corresponding to input data strings. Each lookup entry is composed of the code ("prefix") that denotes the current string and the additional character.

Typical implementations of LZW encoders store these two entries (which fit into fewer than 20 bits) into a single integer value. The LZW algorithm is incorporated into a number of variations. All variations use the above described processing, but differ in their implementation details. One LZW encoding format often used for linework image compression is the TIFF LZW format. A similar format often used for image compression is the GIF LZW format, but that format restarts the compressor more often.

The PostScript LZWEncodeFilter uses a different variant of the LZW algorithm. The LZW algorithm is also used to compress arbitrary (non-image) data. For example, the "compress" utility shipped with Unix systems uses a variant of the TIFF LZW algorithm that results in the same compressed data length as the TIFF LZW algorithm, but which use different code words. The generality and simplicity of the LZW algorithm are both strengths and weaknesses in the algorithm. The strengths are obvious from the widespread use in manifold contexts. The weakness of the LZW algorithm is that for a particular application (say, compressing image data), the algorithm does not use all the available information to maximize the performance.

In most instances, an entire page to be printed does not entirely comprise only continuous tone or linework image data. It is inefficient to compress the whole output page for both data types, since that would incur both extra compression processing costs and, more importantly, extra decompression processing costs in the receiver. The common solution to this problem is to divide the output page into a set of rectangular tiles, wherein each tile contains different image data types. An example of such tiled image format is IOCA (Image Object Content Architecture) Function Set 45. The IOCA tiling scheme has been disclosed in U.S. patent application Ser. No. 09/305,258, entitled "Efficient Presentation of Images", filed on May 4, 1999 and U.S. patent application Ser. No. 09/571,333, entitled "Method and System for Efficient Transmittal and Presentation of Complex Images", filed on May 15, 2000 and both of which are incorporated hereinto in their entirety. Proper generation of a IOCA FS45 datastream allows the receivers (in particular high speed color printers) to efficiently process the datastream at high speeds. This proper generation of the datastream, on the other hand, is a complex process and imposes high processing costs.

These prior art techniques integrate data compression processing with the image data generation functions to identify the nature of the image tile, i.e. continuous tone or linework, in order to efficiently compress the data for transmission. These techniques are ineffective when used in conjunction with raw image data that has already been generated.

Therefore a need exists for a set of process and system that ensure both reasonable processing throughput of a datastream compression process and efficient generation of a compressed datastream when processing a pre-existing dataset that comprises repetitive data patterns.

SUMMARY OF THE INVENTION

According to a preferred embodiment of the present invention, a system and method for efficient data compression is a method for compressing data that identifies a data pattern within a dataset that ends with at least one pre-defined data value and that then stores a code word that represents the identified data pattern. The code words are stored in at least one alternate data structure. The method then identifies a subsequent occurrence of the previously identified data pattern and retrieves the previously stored code word from the at least one alternate data structure.

In another aspect of the present invention, according to a preferred embodiment of the present invention, a system and method for efficient data compression is a system for compressing data that has a data sequence analyzer that identifies a data pattern within a dataset, were the pattern ends with one of an at least one pre-defined data value. The system also has a codeword data storage that stores, in at least one alternate data structure, a codeword that corresponds to the data pattern. The system then utilizes a codeword data producer that determines the codeword that represents the identified data pattern by first determining if the codeword is stored within the codeword data storage, and then retrieving the codeword if the codeword is stored within the codeword data storage or calculating the codeword if the codeword is not stored in the codeword data storage.

BRIEF DESCRIPTION OF THE DRAWINGS

The subject matter which is regarded as the invention is particularly pointed out and distinctly claimed in the claims at the conclusion of the specification. The foregoing and other features and also the advantages of the invention will be apparent from the following detailed description taken in conjunction with the accompanying drawings. Additionally, the left-most digit of a reference number identifies the drawing in which the reference number first appears.

DESCRIPTION OF THE PREFERRED EMBODIMENTS

Figure 1:
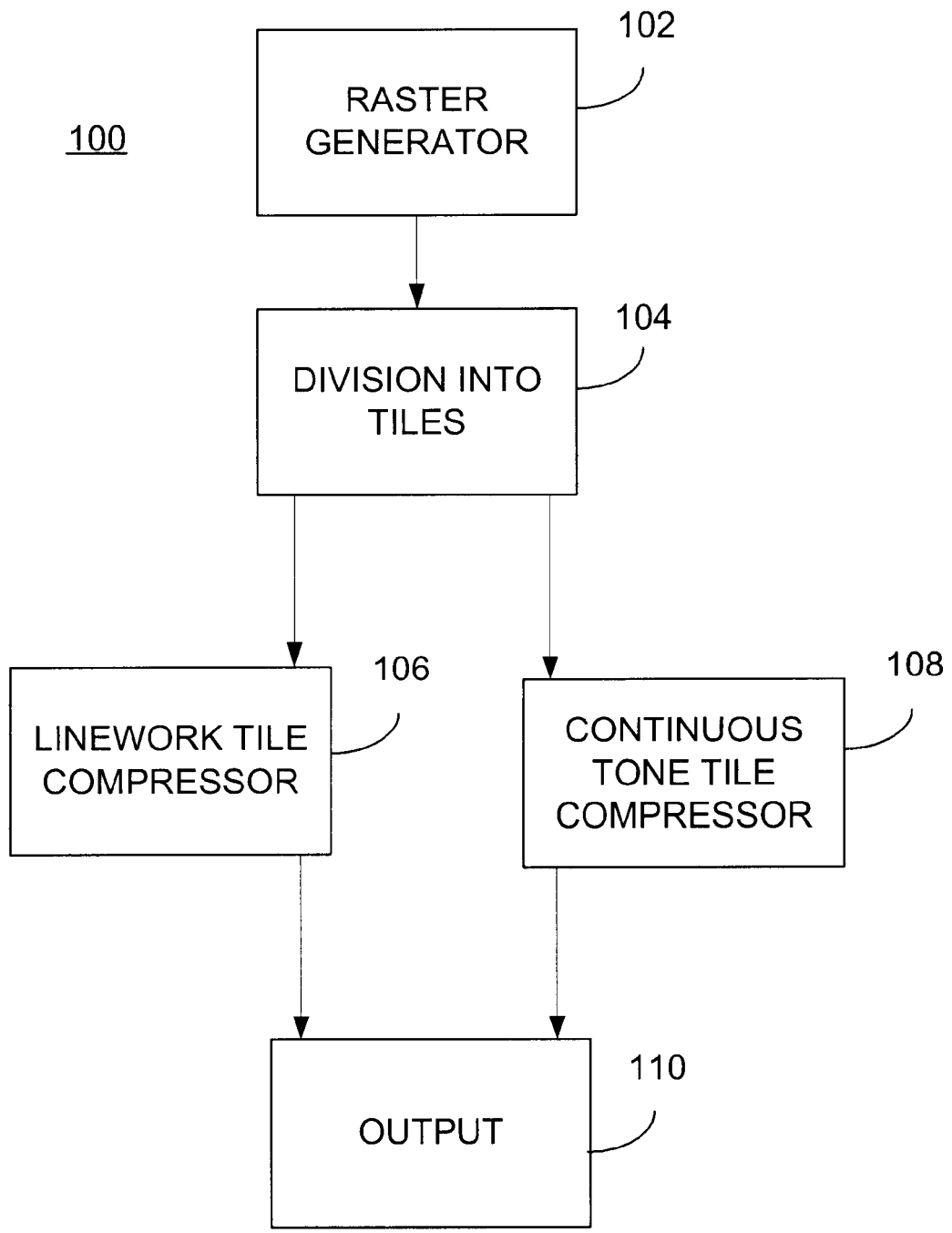
FIG. 1 is a block diagram illustrating a system for efficient tile generation from complex raster data in accordance with a preferred embodiment of the present invention.

The present invention, according to a preferred embodiment, overcomes problems with the prior art by identifying data sequences that contain data elements that are equal to one or more particular data values and storing the substitute code words for those data sequences in an alternate data structure that is able to be efficiently accessed by the data compression processor. The one or more particular data values that are identified in the processing of the preferred embodiments are equal to values that are assumed to be frequently present in the input data set, such as the value 0x00 in image data.

It is important to note, that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The example embodiments of the present invention perform tile generation and classification to identify the tiles within the composite image data that are generated by a raster image generator. Each of the identified tiles consists of one of the two different categories of output image data identified by the example embodiments of the present invention (i.e., linework and continuous tone data). Based upon the category of data comprising the image data group within the tile, the tile generation and classification algorithm then selects the appropriate compression algorithm to encode the image data that was identified within each tile. After the tiles have been identified, the example embodiments perform data compression using compression techniques that include several improvements to the known compression algorithms. These improvements utilize the additional information that is available to the data compressor in order to maximize performance.

The input to the system of the preferred embodiment consists of a composite image data set that contains complex raster image data, possibly divided into a number of spatial strips. The composite image data received by the example embodiment further contains meta-data indicators which describe each pixel in the complex raster image data. The meta-data indicators received by the example embodiments include a valid bit and a mask bit. In the example embodiment, the valid bit contains the valid data value and the mask bit contains the mask data value, which are defined below. In the example embodiments, each colorplane is passed in a separate memory buffer. The colorplane buffers can be either interleaved (i.e., all color plane buffers for a strip passed together) or planar (i.e., all strips for a single color passed together before the next color is started). Strips are able to be specified out of order and strips that do not contain any data are usually not passed.

For each pixel in each colorplane, four values are specified: contone value, linework value, mask bit and valid bit. In the preferred embodiment, the image generator providing input image data to the example embodiments is the Adobe CPSI/IPMV (Configurable PostScript Interpreter), which specifies linework, continuous tone, mask and valid in turn for each scan line. It will be clear to those skilled in the art that the same information can be passed in many different ways.

Conceptually, linework and continuous tone images can overlay each other, such as in the case of text on top of the background image. This is handled in the output datastream of the example embodiments of the present invention by using transparency masks. One data type (Continuous tone image data in our example embodiments) is put on the bottom and the other data type (linework image data in the example embodiment) is combined with a transparency mask and placed on top. The transparency mask for a tile is a bilevel image with the same dimensions as the tile and is interpreted as follows: for each pixel where the transparency mask bit is equal to one, the receiver will print or illuminate the pixel from the tile containing the mask. If the transparency mask bit is equal to zero, the receiver will treat the pixel in the tile as transparent, and show the image data in the plane that is below it. This technique, which is well known in the art, allows overlaying rectangular images on top of one another and printing or illuminating an arbitrary selection of pixels from each.

For efficiency, the example embodiments do not include transparency masks with tiles that contain continuous tone image data, since they are placed on the bottom. Alternative embodiments of the present invention generate transparency masks with continuous tone, for example, if selective transparency of images on the bottom is also desired.

The example embodiments of the present invention classify tiles into one of three categories—continuous tone, linework and bilevel. Bilevel tiles are a special case of linework tiles that contain only black plane data and where all the data values are either zero or 255 (i.e., full saturation). The example embodiments process linework and bilevel tiles in a similar manner, except that different compression algorithms are used and different colorspaces are indicated in output.

According to a preferred embodiment of the present invention, as shown in FIG. 1, an image compression system 100 comprises a raster generator 102, which develops the image data in raster format. In the exemplary embodiment the raster generator is a conventional Postscript data format generator. Embodiments of the present invention are able to also incorporate different image generators that create image data that is compatible with the processing described in this specification. The postscript data generated by the raster generator 102 of the example embodiment produces image data, which contains two additional bits of meta-data for each pixel in each color plane of the image data. Each pixel in each color plane produced by the raster generator 102 of the exemplary embodiment has an associated 'valid' bit and an associated 'mask' bits. The valid bit indicates whether the block contains any data at all. If no data is contained in the block the valid bit is cleared. The mask bit indicates whether the pixel is part of an image that is characterized as a continuous tone image or a linework image. It is obvious that the following processing will work with any image generator that identifies whether pixel data contains data and whether that data is part of a continuous tone or linework image.

The example embodiment processes the individual color planes of the composite image data set, which contains a set of raster image data, that is produced by the raster generator 102. The image compression system 100 contains a division into tiles processor 104, which divides the raster data, produced by the raster generator 102 into a number of tiles. A tile is the rectangular subsection of the entire image. In the example embodiment of the present invention, the tiles are characterized as either containing continuous tone or linework data. The division into tiles processor 104 of the illustrated embodiment includes an image tile identifier and a tile data characterizer. The image tile identifier identifies the image tiles within the composite image data set and the tile data characterizer characterizes the data as either continuous tone or linework image data, as is described herein. Once the image data is divided into tiles, the data is transferred to a tile data encoder, which, in the example embodiment is either the linework tile compression block 106 or the continuous tone file compression block 108, depending upon the type of data within the tile. These compression blocks perform the appropriate compression based upon the type of data in the tile. Once the tile is compressed the tile is produced at output 110.

Figure 2:
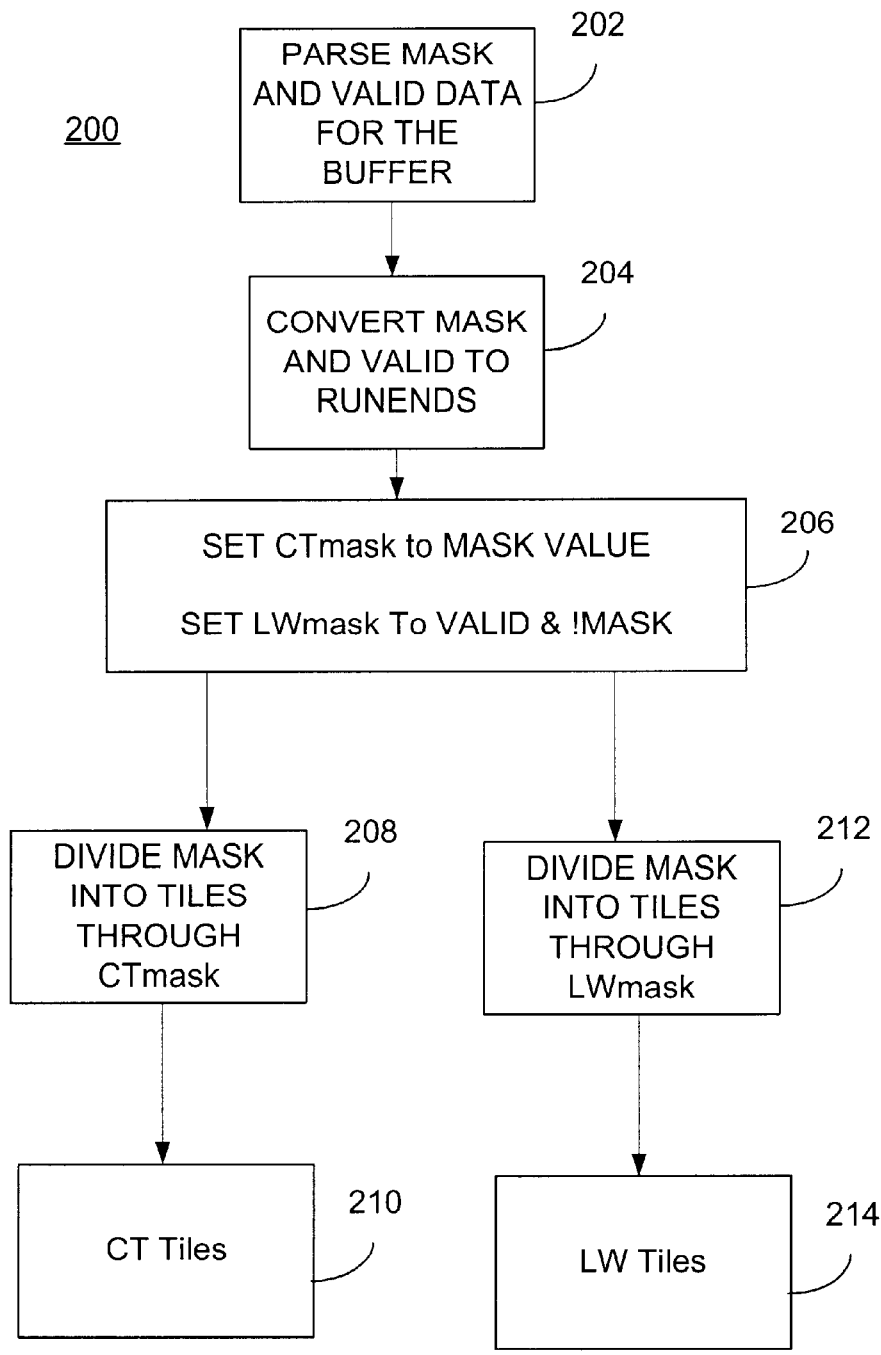
FIG. 2 is a detailed processing block diagram showing the division into tiles processing in the system of FIG. 1, according to a preferred embodiment of the present invention.

The buffer division processing 200 performed by the division into tiles processor 104 is shown in FIG. 2. The inputs into this processor are the meta-data associated with the image data, namely the mask bit and valid bits, that are associated with each pixel within the image buffer. The processing of the buffer division processing 200 begins in step 202 and prepares for processing the meta-data that relates to the raster image. Once the meta-data is prepared, the processing continues with step 204, wherein the mask and data bits are converted into runend format by the composite image data set encoder. The runend data format, which is known to practitioners in the relevant arts, is an encoding format that functions well to encode data that contains long sequences of the same value. The runend format utilized in the example embodiment compresses each scan line separately. The processing of the example embodiments assigns a sequential address within each scan line to each pixel in the scan line. In the format used in the example embodiment, the pixels are numbered starting with 1, while 0 denotes a dummy position that is used to indicate that the first actual pixel in the scan line is black. Runend formatting of the data performed within step 204 comprises processing the mask and data values within the image buffer to identify contiguous data locations that are equal to the same data value. The data encoding in runend format then stores the data value and the address of the data buffer at which that contiguous data sequence ends. The next sequence of data is similarly encoded until the entire buffer, or scan line in the illustrated embodiment, is encoded. As an example, a buffer which contains a sequence of five zeros, followed by eight ones and four zeros is encoded as indicating value zero runs through address five, value one then runs through value thirteen (i.e. it started at address six and runs through address thirteen) and the value zero then continues through address seventeen. The runend data format used by the example embodiment encodes data in blank/nonblank data run pairs by starting with a blank run and ending with a non-blank run. Some runs in this embodiment, including the first and last data runs, are able to have zero length.

The runend data format is similar to run-length encoding, but which encodes the length of equal value data in the data stream. Alternative embodiments of the present invention are able to similarly encode data utilizing the run-length format.

After the valid and mask data are encoded into runend format by the composite image data set encoder, the identify type processing block 206 generates two additional data bits for each pixel. The identify type processing block 206 generates and sets the CTmask data bit to the value of the mask data bit. These bits serve the function of identifying the image data pixel as continuous tone data. The identify type block 206 then sets the LWmask bit to the logical AND of the valid and inverse of the mask bit. A LWmask bit which is set identifies the image data pixel as linework data. The example embodiment of the present invention sets the CTmask bit for a pixel to a value of false, or equal to zero, if the corresponding pixel contains continuous tone data with linework data on top of the continuous tone data. Once the image data in the end run format has been characterized as continuous tone or linework data, the processing divides the data into continuous tone and linework tiles. The divide mask into continuous tone tiles processing block 208 identifies tiles, which contain continuous tone data by examining the CTmask bit for each pixel and outputs continuous tone tiles in the continuous tone tile output block 210. The divide mask into linework tiles processing block 212 identifies tiles which contain linework image data by examining the LWmask bit for each pixel and outputs those tiles in the linework tile output block 214.

The division of the image into tiles is based on examination of the transparency mask. The processing of the preferred embodiment identifies tile regions that cover all areas of the image that contain transparency mask bits that are set to a value of true, which is also referred to as being equal to one. Some image data will allow tiles to be identified directly from the transparency mask data, such as the case where the mask bits are equal to one for a rectangular area. Other image data, e.g., where the mask bits are equal to one in a non-rectangular geometric area, require further processing to efficiently identify and classify the rectangular image data tiles. An example of image data which requires further processing are text data, which has transparency bits equal to one where the letters appear and are equal to false or zero to indicate the spaces that are within the letters. The example embodiments include processing which precludes erroneous identification of different tile regions from scan line to scan line.

The processing of the example embodiments aggregates data defining multiple scan lines into a divisions buffer. The division buffer of the example embodiment contains a storage location for each pixel in a single scan line and is encoded in an runend format. The division buffer is initialized so that each location is equal to false or zero. The image data is processed by adding each new scan line into the division buffer by performing a logical-OR of the next scan line with other scan lines previously aggregated into the division buffer. This aggregation results in the division buffer having a location equal to one for every column that contained a value of one in any scan line aggregated into the buffer. This technique removes the high frequency noise from the data used for division and allows larger tiles to be efficiently identified.

Figure 3A:
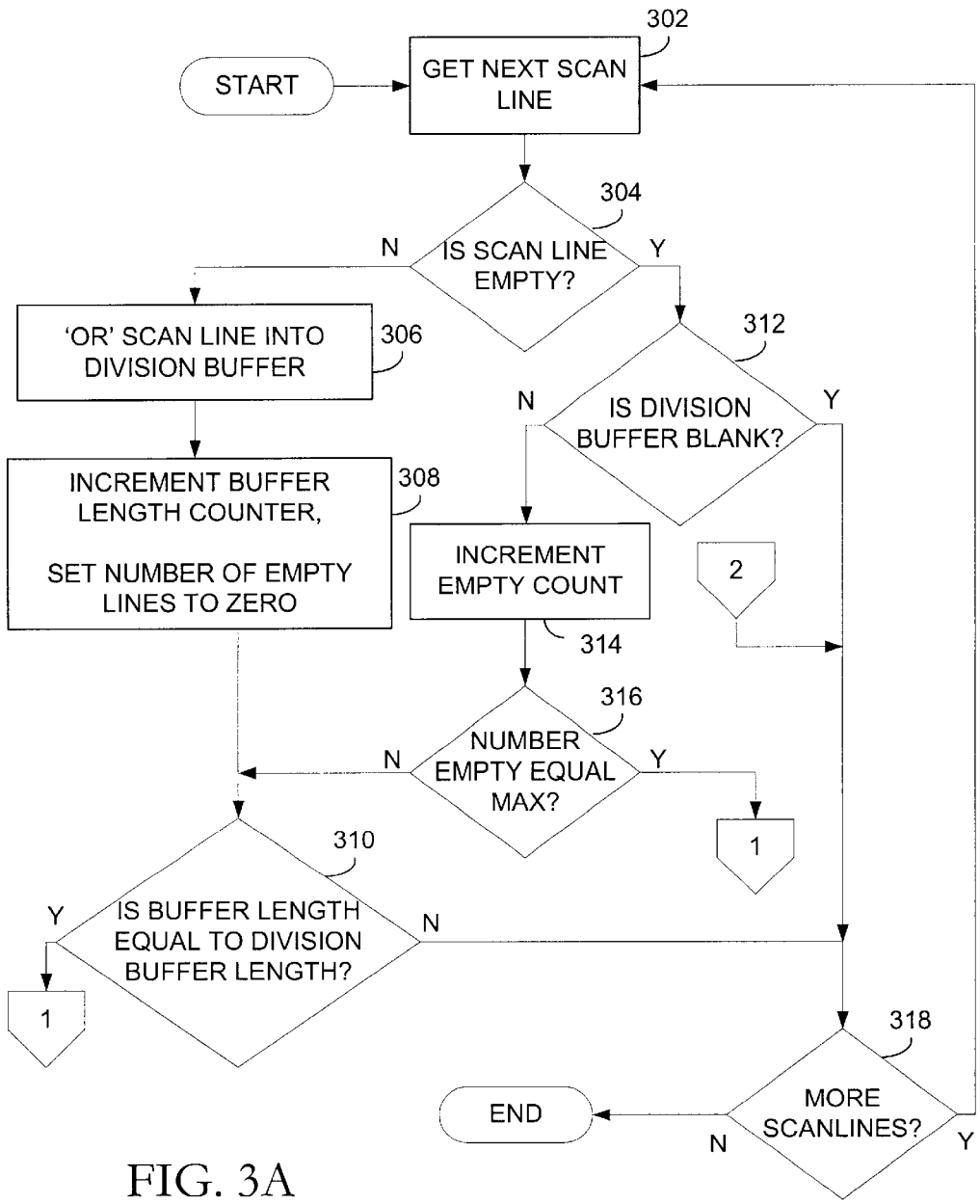
FIG. 3A and FIG. 3B are an operational flow diagram illustrating the processing performed by the linework tile compressor of FIG. 1, according to a preferred embodiment of the present invention.
Figure 3B:
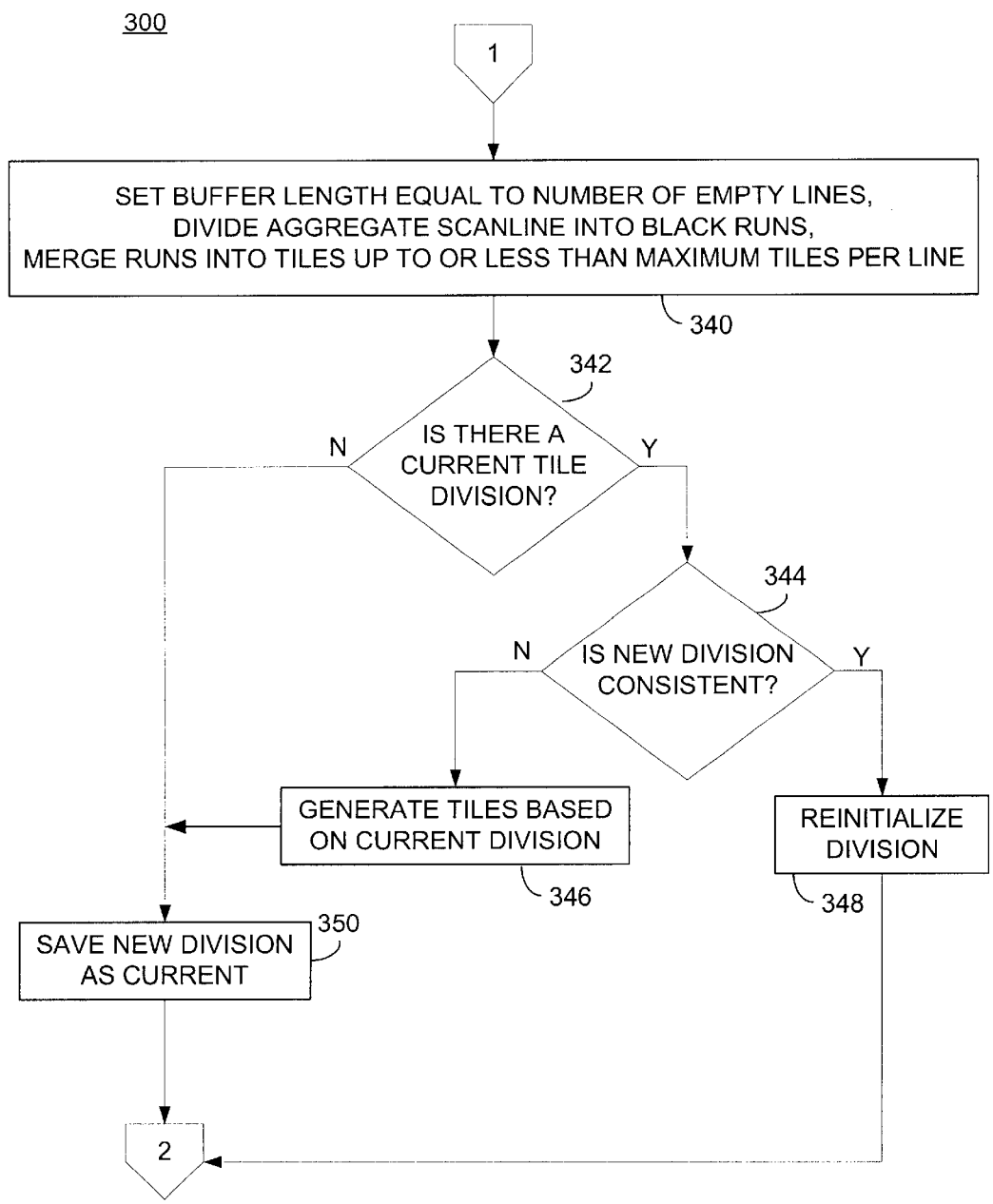

The divide masks into tiles processing 300, which is performed by the divide mask into tiles processing block 104, is illustrated in FIG. 3A and FIG. 3B. The divide mask into tiles processing block 104 operates on the mask data bits which have been converted into an runend format. The initial processing step operates on the next scan line, which is initially the first scan line, in step 302. The processing of step 304 determines, through examination of the mask data bit for each pixel in that scan line, if there is any data within the current scan line or if the scan line is empty. If the scan line is not empty, i.e., there is data within the line, the mask data is combined into the division buffer in step 306 through performing a pixel-by-pixel logical-OR operation with each pixel of the new scan line and the corresponding pixel in the division buffer. The corresponding pixels for purposes of accumulating scan lines in the division buffer are the pixels which are in the same column of each scan line being accumulated into the division buffer. After the scan line is has been combined, or aggregated, into the division buffer, step 308 is performed wherein a counter value that records the "length of the buffer" is incremented to maintain the count of the number of scan lines which have been aggregated into the division buffer. The number of empty contiguous lines is set to zero since the processing has encountered a non-empty scan line. The processing then continues with step 310 to determine if the buffer length counter, which indicates the number of scan lines aggregated into the division buffer, is equal to the maximum value as is set by the system configuration. The processing of step 310 and subsequent steps is described below.

If the processing in step 304 determines that the scan line is empty, the processing advances to step 312 to determine if the division buffer is blank. The division buffer is blank if no scan lines have been aggregated into the division buffer. If the division buffer is blank, the processing advances to step 318 to determine if more scan lines remain. If no scan lines remain as is determined in step 318, processing for this plane of the image ends. If scan lines remain to be processed, processing returns to step 302 to process the next scan line.

If the processing of step 312 determines that the division buffer is not blank, the processing advances to step 314 where a counter is incremented that reflects the number of empty scan lines that have been encountered since the beginning of aggregation of data, along with associated meta-data, into the current division buffer data structure. If the empty scan line count is determined, in step 316, to be equal to a maximum value of empty scan lines that are able to be aggregated into a division buffer, as determined according to the configuration of the system, processing advances to step 340 as shown in FIG. 3B. If the processing of step 316 determines that the empty scan line count is not equal to maximum value, the processing continues with step 310.

The processing of step 310 determines if the length of the division buffer, i.e. the maximum number of scan lines which are able to be aggregated into the division buffer is equal to the buffer length, which indicates the number of scan lines currently aggregated into the division buffer and which is incremented as each scan line data is aggregated into the division buffer. The length of the division buffer is determined by the configuration of the system. If the buffer length is not equal to the division buffer length, the processing continues with step 318 to determine if there are more scan lines to process. If the buffer length is equal to the division buffer length, processing continues with step 340 as shown in FIG. 3B.

The illustration of the divide masks into tiles processing 300 is continued in FIG. 3B. The processing of step 340 sets the counter indicating the length of the division buffer to the number of empty scan lines as determined by processing the scan lines combined into the division buffer. The processing of step 340 in the example embodiment further identifies tiles within the division buffer by analyzing the aggregate meta-data contained in the division buffer. The divide aggregate scanline into black run processing divides the aggregate scan lines contained in the division buffer into runs of pixels with are to be printed and runs which have not print data. The term "black" in this context is used to refer to a pixel with any level of pigmentation, and not just pixels that are truly black in color. A "black" pixel in this context simply means the pixel contains non-blank data. A run is a contiguous set of bits (or pixels) that have the same value. An example of a run is a string of data bits each set to a value of one, which indicates that the pixels that correspond to those bits are to be printed. Another example of a run is a set of continuous image data bits that are all set to false or zero to indicate that the pixels associated with those bits are not to be printed. The processing of step 340 then merges the runs of image data, which contain non-blank data into tiles. This step identifies a set of tiles, referred to as the new tile division, that are present in the division buffer based upon an aggregation of scan lines that includes the most recent scan line. The processing of step 340 will merge the non-blank data runs into a number of tiles that is less than a maximum number of tiles per scan line, as is set by configuration of the system.

The processing of the example embodiment divides the image data in each division buffer into one or more tiles. The processing within step 340 develops a list of data tile ranges, which is referred to as a tile division. The tile division is a list of ranges within an accumulated division buffer that are determined to contain data. Development of the tile division data set does not modify the image data itself but merely results in the establishment of a set of tile range definitions. A tile division defines the width and horizontal placement of each identified tile within a set of scan lines that were accumulated in a division buffer. For example, a tile division could define three tiles within the three column ranges of 120–256, 2004–3800 and 4096–4100. This would result in establishing that all the other pixels column ranges are blank. The individual scan lines that were aggregated into the division buffer are able to contain runs of pixels which do not contain data, since the data in the division buffer is an aggregation of multiple scan lines. Since each division buffer covers a number of scan lines, each such range naturally corresponds to a tile in the image.

Processing then advances to step 342, wherein the processing determines if the there is a current tile division, i.e. a tile division definition that had been determined during the processing of the previously accumulated and presently processed division buffer. If the processing of step 342 determines that there is a current tile division, the processing advances to step 344 to determine if the new tile division, which is the tile division determined by the processing of the presently accumulated division buffer, is consistent with the current tile division. The new tile division is determined to be consistent if the current tile division and new tile division are the same or sufficiently similar as is defined below. If the new division is much different and determined to not be similar, the processing of the example embodiment advances to step 346 wherein the range of scan lines for the tiles described by the current division is terminated. The tile lengths are based upon the number of scan lines over which the current tile division is applicable, which are able to include several division buffers if the "new" tile divisions that were calculated during the prior processing of successive division buffers identified tile divisions that were sufficiently similar.

The processing of step 344 in the example embodiment compares the runs of pixels with data in the current tile division, based upon the previous (and possibly prior) division buffers and the new tile division which is the tile division calculated for the presently accumulated division buffer. In the example embodiment, tile divisions are considered to be consistent if all of the runs of pixels that contain printable data in the presently accumulated division buffer are also present in the current tile division. In the case where the two divisions match in that manner, the current tile division is said to contain the tile divisions present in the new tile division. It is clear that other embodiments are able to utilize different criteria to determine consistency between the current division buffer and the new division buffer. Alternative embodiments establish a threshold of pixels which contain data in the new tile division that are not present in the current tile division. If the new tile division contains a small number of pixels that contain data in addition to the pixels that contain data in the current division buffer, the alternative embodiments modify or adjust the current division buffer to also include this small number of pixels. This modification is made in these embodiments by performing a logical-OR of the new tile division and the current tile division to effectively add the tile regions of the new tile division to the current tile division. These embodiments retain the current tile division over the image scan lines that had been previously processed, and increase the length of the tiles in the current scan line to include, at least, the presently accumulated division buffer. This alternative processing then continues for multiple division buffers that have new tile divisions that differ only slightly from the current tile division and thereby extends the current tile division over those multiple division buffers.

If the new division is consistent, i.e., it is the same or only slightly different from the current tile division, the current tile division is retained or the new tile division is used to slightly modify the current tile division. In this case, the tile division developed for the previously processed division buffers is retained for the scan lines contained within this division buffer. The new tile division is then reinitialized for the next iteration of division buffer accumulation and analysis. The processing then continues with step 318 as shown in FIG. 3A.

If it is not determined that there is a current tile division in step 342, or after the processing of step 346, the processing of step 350 is performed to save the new tile division as the current tile division for the next processing iteration. The processing then continues with step 318 as shown in FIG. 3B.

Compression of Data Within Each Tile

Once the image data have been divided into a number of tiles according to the type of image data, the data within each tile is compressed through the use of an encoding algorithm to compress the quantity of data contained within the tile. The encoding or compression algorithm is selected according to the type of data that was determined to be contained within each tile. Image tiles containing continuous tone data are compressed in the example embodiment through the use of a modified JPEG algorithm. Linework image tiles in the example embodiment are compressed with an LZW compression algorithm that is modified to use the mask and valid data bits within the image data to accelerate the compression processing.

Compression of Continuous Tone Image Data

Continuous tone image tiles are compressed in the example embodiment through the use of a conventional JPEG compression algorithm, which is modified to identify continuous tone image data that contain the same value for all pixels within a color plane. Each color layer or plane of an image in the example embodiment is independently processed and compressed. The JPEG algorithm performs efficient compression of continuous tone data but a tile of continuous tone data that has a single data value stored in all pixels within a particular color plane of that tile is able to be more efficiently processed by noting the constant value that is present for all pixels in that tile and encoding a continuous tone tile that contains that value in all pixels. If a color plane within a tile contains continuous tone data that is all blank, i.e., where all pixels contain the value "zero," the example embodiments of the present invention are able to realize additional processing efficiencies. If the image tile has been characterized as containing continuous tone data, an example embodiment of the present invention processes the data with a single intensity image detector to determine if one or more color planes within the tile contain the same value in each pixel and are thus "single intensity color planes." If the single intensity image detector detects that there is a single intensity color plane within a continuous tone image tile, the example embodiment utilizes a single intensity image data producer to generate the encoded data for that color plane of the image tile by producing a data output that consists of predominately pre-computed values instead of executing the actual encoder processing. Standard JPEG Huffman tables are used in the example embodiment. Alternative embodiments similarly use arbitrary tables. Yet other embodiments use special tables that contain only zero values.

The JPEG compression algorithm of the example embodiment operates on 8×8 blocks of pixels (i.e., pixel data blocks). In the JPEG algorithm, a Discrete Cosine Transform (DCT) is applied to each pixel data block, the values computed by the DCT are quantized and these values are then entropy coded. In a baseline Huffman JPEG encoding of a single intensity color plane, the final entropy codes are able to be produced without actually running the algorithm. There are three parts to the generated entropy coded JPEG datastream produced by the example embodiment of the present invention: namely startup, steady state and finish.

In the conventional JPEG encoding of pixel data blocks, the zero-frequency coefficient produced by the DCT transformation is treated differently from the coefficients for non-zero frequencies. The zero frequency coefficient of the first block is itself entropy coded in an entropy-coded segment. The entropy coding for each subsequent pixel data block then entropy codes the difference between the zero frequency coefficient value in the preceding block and the zero-frequency coefficient value of the current pixel data block. A single intensity color plane has several characteristics that are exploited by the preferred embodiment in order to improve processing efficiency. The DCT processing of a single intensity color plane produces coefficients for non-zero frequency, which are all equal to zeros, since the image has no intensity changes from pixel to pixel. The zero frequency coefficient of the first pixel data block is able to be nonzero, but because all of the blocks are identical (i.e., have the same intensity value), the differences between the zero frequency coefficient values are all equal to zero. These characteristics result in entropy codes for the first block that are different than the entropy codes for all of the remaining blocks.

Given a particular set of Huffman tables, a bit pattern is able to be pre-computed for the first pixel data block in the image and then for the remainder of all of the pixel data blocks in the image. In general, the number of bits needed to encode a pixel data block is not evenly divisible by the size of the data elements used by a particular processor. Processors that compress image data typically use data elements that are either eight bits in length or multiples of eight bits such as thirty two bits. Pixel data blocks within single intensity color planes are often encoded in less than the number of bits within the data elements of the processor. The datastream produced by the example embodiment that contains the entropy-coded data is represented as a sequence of bytes that are each eight bits in length. Alternative embodiments utilize output data elements with different length to correspond to the hardware architecture of the processor used by that embodiment, such as thirty-two bits or another number of bits efficiently used by the processor of that embodiment.

The processing of the single intensity data producer of the example embodiment combines pixel data blocks so as to develop an output compressed data set that contains the entropy encoded data. The encoded data is more efficiently stored in eight bit bytes or blocks, or in another fixed size data element that is used by a particular embodiment, than in a bit-oriented format. The definition of the pixel data block combinations used by the example embodiment is as follows. Let N be the number of bits that are used to encode the first block and let M be the number of bits used to encode any other block in the image. The processing of the example embodiment assumes that M is not a multiple of eight or of the other data element size used by an alternative embodiment. Then, there exist a pair of numbers K and L such that the quantity N+KM and the product LM are evenly divisible by eight or by the data element size used by the particular embodiment.

This means that the startup segment of the encoded data stream produced by the example embodiment for a single intensity, continuous tone image data set encodes K+1 pixel data blocks in an initial compressed output data block and each steady state cycle produces a middle compressed data set that represents L pixel data blocks. In the case of a single intensity color plane which contains a total of W pixel data blocks to be encoded, setting E=(W−K−1) % L, where "%" operation indicates the modulus operation, E represents the number of pixel data blocks that are to be encoded into the final output data segment by the finishing part of the processing. The final output data segment of the encoded datastream is generated by concatenating the encoding bits of the E blocks, left aligning them and then padding with "1" bits until the byte boundary.

In the example embodiment, the initial compressed output data segment is pre-computed based upon the constant value within the single intensity color plane. Each "cycle" or middle data segment, meaning the code sequence for the L blocks that are able to be encoded within the number of bits in the data element that is used by the particular embodiment without any leftover bits, is also pre-computed in the example embodiment. The final output data segment, assuming E is 1, 2, . . . L−1, are also pre-computed in the example embodiment. To encode an image, the algorithm of the example embodiment first outputs the initial compressed output data segment and stores the fact that it encoded K+1 pixel data blocks. The algorithm then cycles through the steady state, outputting one or more middle data segments that each contains the codes for L pixel data blocks, until less than L pixel data blocks remain to be encoded. The number of remaining pixel data blocks, which is represented by E, determines the value of the final output data block and therefore the end of the encoded data stream. The final output data segment is pre-computed each value of E in the exemplary embodiment.

The example embodiment of the present invention uses standard Huffman tables and when encoding a single intensity color planes of a continuous tone image dataset, the example embodiment uses a value of K equal to zero, a value of L equal to four. In the example of a single intensity color plane that is blank, i.e., contains a zero data value in each pixel, the initial compressed output data segment is the byte sequence 0xf9 0xfe (where the 0x notation indicates hexadecimal numbers and the initial compressed output data segment encodes just the initial pixel data block, which is encoded using two bytes). The steady state cycle in this example produces a middle compressed output data set by replicating a middle data segment that encodes four pixel data blocks into middle data segments that contain three bytes: 0x8a 0x28 0xaf. There are 4 possible final output data segments in this example for the entropy coded segment depending upon the value of E. They are:

0xbf—for E=0

0x8a—for E=1

0x82 0x2b—for E=2

0x8a 0x28 0xaf for E=3

Figure 4:
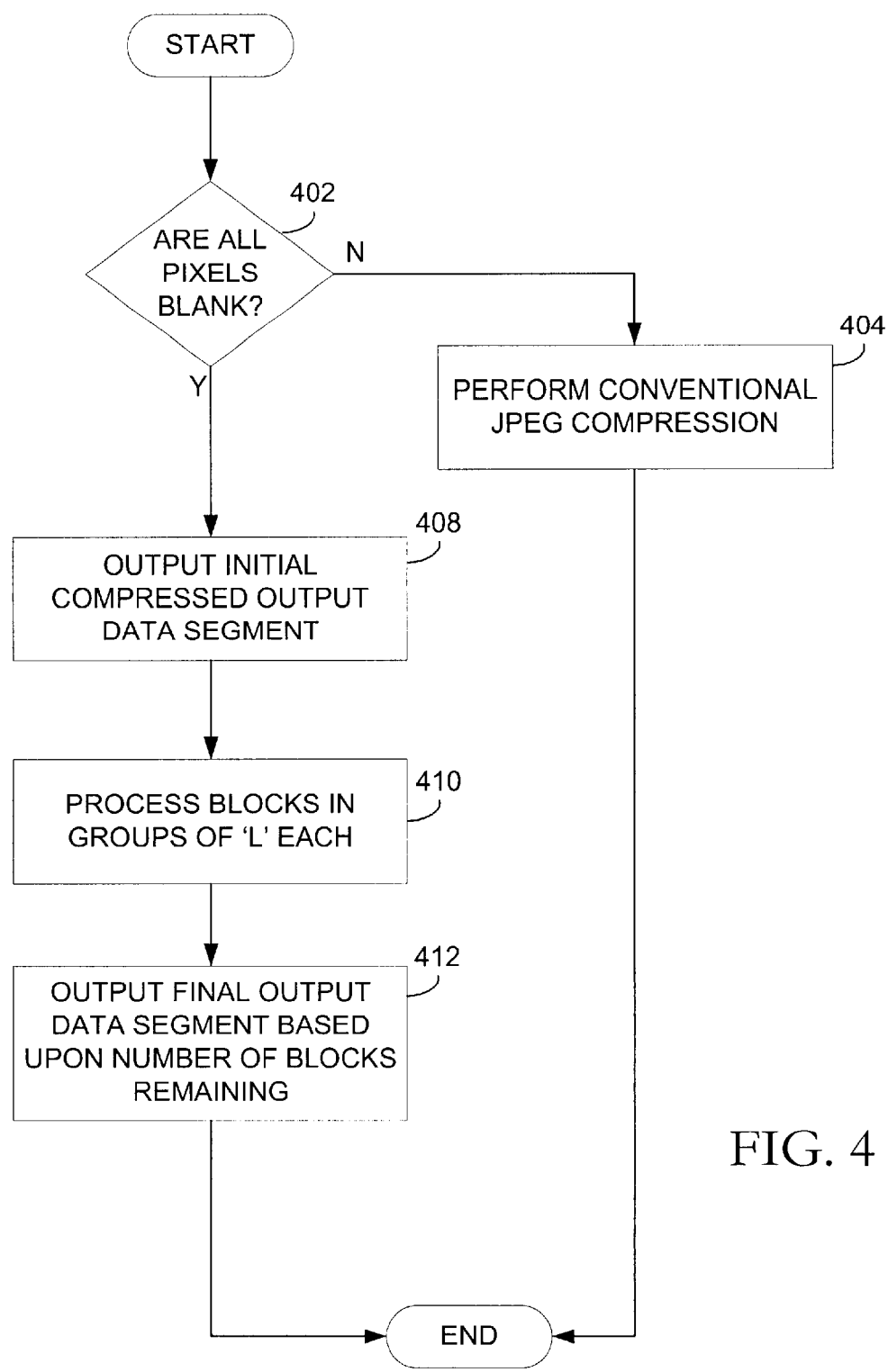
FIG. 4 is an operational flow diagram illustrating the processing performed by the continuous tone data compressor of FIG. 1, according to a preferred embodiment of the present invention.

An example continuous tone compression processing flow 400 is illustrated in FIG. 4. The example embodiment of the present invention processes each color plane of color images separately. The example continuous tone compression processing flow 400 of the example embodiment is the processing that is performed for each color plane of the continuous tone image tile being processed by the tile data encoder of the example embodiment.

The processing of the tile encoder begins, at step 402, by determining if all pixels in the continuous tone image portion all contain a single value. The example embodiment encodes each color plane of the continuous tone data separately, thereby allowing special processing of single intensity color planes even if the entire image is of a single intensity. The single intensity color plane identifier of the example embodiment of the present invention performs special processing to determine if a color plane within a tile is blank, i.e., contains all zero data values for each pixel, by examination of the valid bit that is contained in the metadata associated with the image. The example embodiments perform this identification during the tile generation process described above. If this determination was not made during the tile generation process, the example embodiment of the present invention then examines the data values within the pixels to determine if they are all equal to the same value. If the pixels within the color plane of the tile being processes are not all blank or equal to the same value, the processing continues by performing conventional JPEG encoding, at step 404, of the image or color plane being processed.

If the pixels of the color plane or monochrome tile being processed are determined to have the same value for each pixel, at step 402, the processing continues, at step 408, by outputting an initial compressed output data segment for the JPEG image data that is determined according to the constant value for each pixel within the image or color plane, as is described above. Different embodiments of the present invention store pre-computed initial compressed output data segments for each constant data value within an image, and alternative embodiments calculate the initial compressed output data segment as a function of the constant value.

Some embodiments store pre-computed initial compressed output data segments for common single intensity images, such as blank images, and compute the initial compressed output data segments for images or single intensity color planes that have a different constant intensity for each pixel. If one of these embodiments has stored initial compressed output data segment that corresponds to the constant value of each pixel in the image or color plane, the appropriate initial compressed output data segment is retrieved by these embodiments as opposed to being calculated.

Subsequent to producing the initial compressed output data segment, the processing then processes, at step 410, the remaining pixel data blocks that are able to be evenly encoded into integer multiples bits contained within the data element size used by the processor of the particular embodiment (i.e. which may be compressed into an encoded output that comprises eight bit bytes or into another size data element used by the processor of the particular embodiment) in order to produce the middle compressed output data set. The example embodiment of the present invention uses eight bit bytes and therefore processes groups of "L" pixel data blocks that are able to be evenly stored in eight bits bytes. The example embodiment stores four pixel data blocks into each middle compressed data segment, which are each three bytes long, as is described above. The pixel data blocks are all equal to the same value and therefore are compressed into the middle compressed data segments that are all the same codeword. Other embodiments that have processors that are able to more efficiently use different data element sizes similarly process middle compressed data segments that are able to be evenly stored in a different number of bits, such as thirty-two bits.

After the image data is processed in groups of "L" pixel image blocks each, the remaining input image data to be compressed comprises less than "L" pixel image blocks. The processing then outputs a final output data segment, at step 412, to represent the remaining input image pixel data blocks. The final output data segment is described above and consists of compressed output data code words that represent the less than "L" blank input image data bytes that remain in the tile to be compressed.

Compression of Linework Image Data

The preferred embodiment utilizes an LZW compression algorithm that has been modified to incorporate into the data compression process the mask data bit that is available in the image data. The example embodiment utilizes an LZW data encoder, which is based upon the TIFF LZW algorithm.

In the processing performed by the example embodiment of the present invention, pixels that have their transparency mask is set to zero, as indicated in the runend formatted data, are not included in further image processing. Pixels that have their transparency mask set to zero, do not have to be read from the image because they are known to be blank. Such blank pixels are able to be represented in the input to the data compression algorithm by a zero by simple reading of the mask bit value. Other embodiments may represent blank pixels using any arbitrary value suitable to the data compression processing. Linework images, especially those that are computer-generated, usually contain a lot of white space (i.e., pixels which contain a data value of 0×00). In addition, there are often a number of entire scan lines within this image data, which are blank, i.e. all pixels in the scan line contain the data value 0×00. The example embodiment uses an extension of the LZW algorithm to recognize and specially process such blank pixels and blank scan lines to increase the speed of data compression processing. The LZW algorithm extension uses the data in the transparency mask along with the above assumptions concerning the amount of blank data commonly present in linework images to increase the processing speed of linework image compression. The compressed data produced by the extended LZW processor of the example embodiment conforms to the format of conventional LZW data compression and is able to be decompressed by a conventional LZW decompression algorithm.

In a linework image with a transparency mask, the character (data byte) zero is present and is encoded more often than any other data value. The example embodiment utilizes this heuristic observation and utilizes a modified LZW compression algorithm, which is optimized for the compression of a series of data byte values equal to zero. The LZW compression algorithm of the example embodiment utilizes a conventional hash table that contains the prefix-character combinations, or data patterns, of a conventional LZW compression algorithm. In the example embodiment, however, an input data prefix-character combination where the next input data character is equal to 0×00 is handled separately and not via hash table processing.

The example embodiment of the present invention handles data characters equal to a predefined data value 0×00 as follows. The example embodiment of the present invention uses an alternative to maintaining the prefix-character combinations in a hash table when processing next character data byte values equal to zero. The example embodiment incorporates a data sequence analyzer which performs, in addition to the conventional LZW processing of the input data, an identification of data input strings where the next character being processed is equal to zero. In the case of a next character having the value of zero, the example embodiment of the present invention performs specialized processing.

The example embodiment comprises a codeword data storage which incorporates a dedicated alternate data structure to store compressed data codewords that are associated with strings that end in the character zero. Once the data sequence analyzer determines that the currently processed string ends in a zero, the codeword data storage determines if a codeword for that string has been stored. If that codeword has not been stored, the conventional LZW processing is performed to generate the codeword, and the codeword data storage then stores that generated storage for subsequent use. If the codeword for the currently processed string has been stored, the codeword data producer then retrieves that value and produces the stored codeword to the codeword output generator for output as the compressed data codeword. The codeword output generator of the example embodiment receives compressed data codewords by accessing either the hash tables according to the conventional LZW algorithms, or by accepting input from the codeword data producer which accesses compressed data codeword within the codeword data storage. The codeword data storage of the example embodiment uses the location of COMBINED0 array to contain the information for the prefix-character combination where the next input character is zero. COMBINED0 array has an element for all possible compression output codes which are produced when the next input value is zero and each element of that array is initialized to a predetermined value that is known to not be a valid compression output code (in the example embodiment, the entries in the COMBINED0 array are of the "short integer" data type and are initialized to −1). For every input data stream code that is followed by the zero character, the COMBINED0[code] array element contains the code that describes sequence containing the string 'code' followed by a zero data byte.

As an example of the processing performed for a linework image, which presumably contains a large amount of blank pixels, the image data contains non-zero data followed by a length of data values equal to zero. When the next character of the processing is detected to be a zero, the data located within the array COMBINED0 at the location indexed by the value of the LZW code word for the data string preceding this zero data character is examined to determine if that value in the COMBINED0 array is equal to −1. If the value is equal to −1, then no code word has been stored in that location, and the resulting code word is generated by the conventional LZW compression algorithm and is stored into the corresponding location of COMBINED0. If the value stored in that location of COMBINED0 is not equal to −1, the value is retrieved and used as the code word.

Each element in the COMBINED0 array in the example embodiment contains the code that describes the string composed of the string that is described by the index into the array, followed by the zero character. As an example, assume that code "298" describes string 0x37, 0xff, 0xaa, and let the value in the array element COMBINED0[298] be equal to 325. This represents that the code 325 describes the string comprising 0x37, 0xff, 0xaa, 0x00. This modification to the LZW algorithm to process speeds the algorithm considerably by obviating the need to perform the hash table processing for input data sequences equal to zero. Although this processing is practically performed for one or a few characters, such as character "zero," performing this processing for all characters (which would result in requiring the maintenance of 256 "character0" arrays) would require the use of a large amount of memory that could result in memory cache trashing.

The second array used by the example embodiment is called COMBINED1 in the following description and is configured to contain the LZW encoding code word that is associated with a continuous stream of data values that are equal to zero where the length of the continuous stream of zeros is equal to the index value into the array COMBINED1. For example, the value stored in COMBINED1[x] is equal to the encoding code word for a length of x bytes that contain the value zero. This provides an alternative to following a "len" long chain of combined[0] entries by determining the total length of zero elements in the data to be encoded and simply retrieving the relevant code word. Each of these two arrays is dimensioned to hold an integer for all the possible output code words. Every time the LZW compression algorithm is restarted in the example embodiment, each array is initialized to −1 in all positions.

The example embodiment also performs specially optimized processing for long string of zeroes. In the example embodiment, the "zeroCodeArray" array contains a complete LZW compressed sequence, 256, 0, 258, . . . , 4093. In this encoding, the initial 256 and 0 are encoded using 9 bits. The whole array occupies 5406 bytes. Assuming a constant character, a part of this array is able to be copied as a valid datastream.

As an example of the above processing, let N be the number of zeroes to be encoded. Let K be the largest integer such that K<4093 and K*(K+1)/2 is not greater than N. Then K+1 is the last code to be output and the contents of zeroCodeArray is able to just be copied to the output until the last code is output. The remaining zeroes are able to either be encoded using the above described algorithm, or an alternative embodiment is able to calculate portions of the zeroCodeArray that are to be output by the encoder.

In the unlikely event that there are more than 7,363,203 zeroes to be encoded, the algorithm outputs the full array and restarts. The remaining zeroes are encoded again using regular blank algorithm.

An example of the processing which combines efficient zero data handling and the mask data, according to an example embodiment of the present invention, is illustrated in the following pseudo-code.

```
zeroSequenceLength=1
COMBINED1[0] = 0
Loop over scanlines
    if current mask scanline is blank
        find the number of blank scanlines following the current one
        advance the line counter over the blank lines
        set nZeroesToEncode to the total number of pixels in the blank lines.
        update the COMBINED1 array if there is a not-yet-recorded sequence
of zeroes encoded in COMBINED0
        run the regular algorithm for zero (i.e., using the combined0 table) until
a new code is issued
        based on COMBINED1, we know then the next code will need to be
issued
        - this gives us delta (which is the number of zeros encoded in the first "all-
zero" string code word)
        the code sequence for the remaining zeroes is read from the
zeroCodeArray and output
            COMBINED0 and possibly COMBINED1 arrays are updated
            the remaining zeroes are encoded using either regular algorithm or
combined1
    else
        loop over white/black run pairs
            encode white run hardcoding character to 0x00 and using
combined0 instead of hash table
            loop over the characters in the black run
            if character is 0x00
                encode it using COMBINED0
            else
                encode it using the regular hash table
            end black run loop
        end loop over run pairs
```

-continued

```
    end if (scanline blank or not)
end loop over scanlines
```

Figure 5:
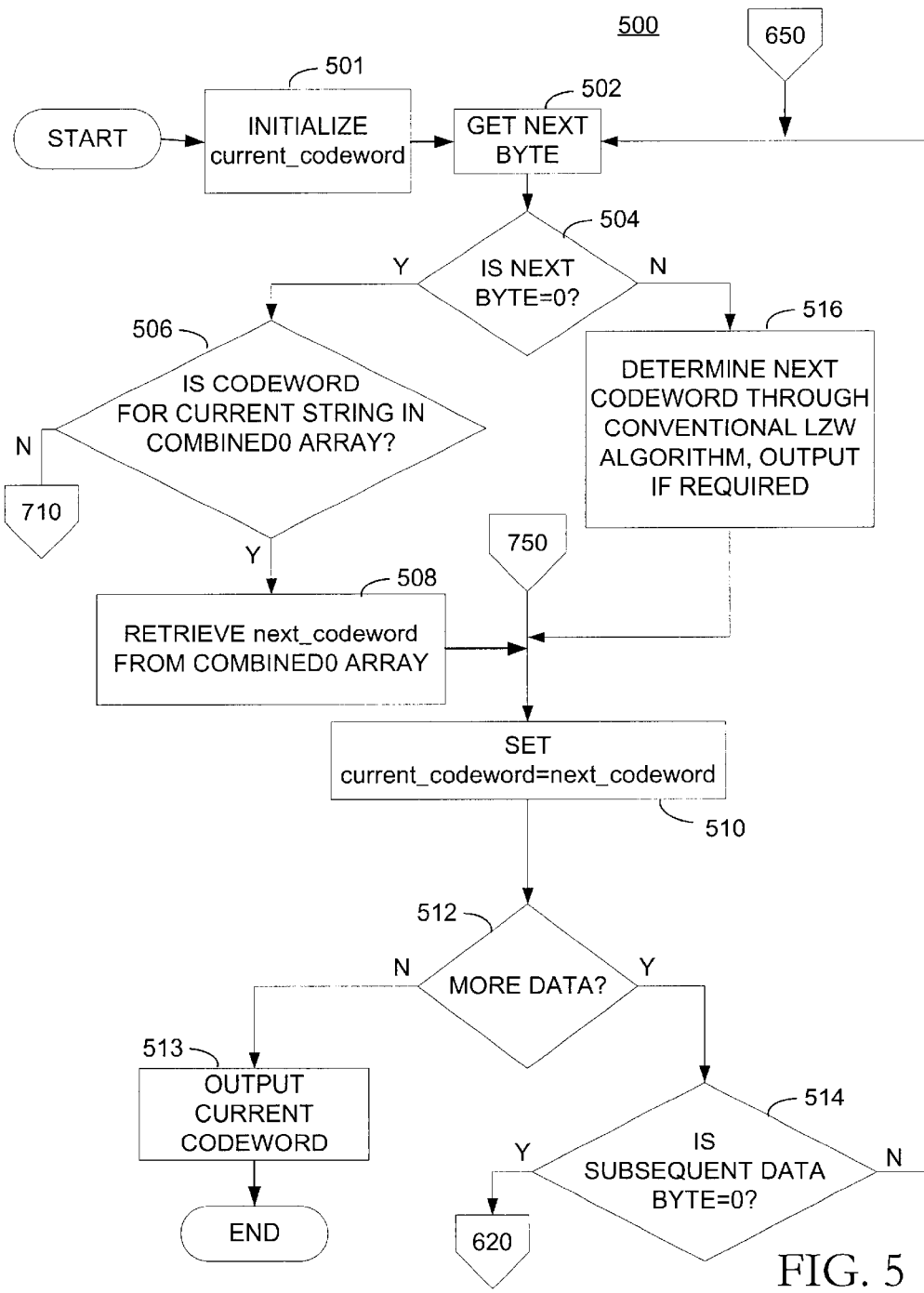
FIGS. 5, 6 and 7 are operational flow diagrams illustrating the specialized processing performed by the linework tile compressor of FIG. 1, according to a preferred embodiment of the present invention.

An example linework compression processing flow 500 that is performed by the example embodiment of the present invention is illustrated in FIG. 5. The example linework compression processing flow 500 is performed upon linework tiles as identified by the division into tiles processor 104. The example linework compression processing flow 500 begins, at step 501, by initializing the "current code word" variable to correspond to a null string. The current code word variable contains the value of the last encoded compressed data code word and represents the string that precedes the "next byte" that is actually the byte being currently processed by the compression algorithm. One use of the current_codeword value is to access the COMBINED0 array when the next data byte is equal to zero, as is described herein. The processing then continues by beginning a processing loop, at step 502, that is executed for image bytes that are in an image tile that contains a linework image. The processing loop begins, at step 502, by reading in the next byte, which is initially the first data byte of the linework image data. The processing then determines, in step 504, if that byte is equal to zero. If the image data byte is equal to zero, the specialized processing of the example embodiment is performed, as described below. If the image data byte is not equal to zero, the processing flow continues, at step 516, to determine the next code word through calculation according to a conventional LZW algorithm. The next code word represents the string comprising the "next byte" that was previously read, and possibly one or more data bytes that precede the next byte, as defined by the LZW compression algorithm. The processing then determines, also at step 516, whether the next code word should be output as the next compressed data output data element and if the code word is to be produced as an output, that value is provided as an output according to the conventional LZW algorithm used by the particular embodiment. After the next code word is calculated according to a conventional LZW algorithm, the processing continues, at step 510, by setting the current_codeword equal to the code word calculated above. The processing then determines, in step 512, if there is more data in the image tile to compress. If there is no more data to compress, processing advances to output, at step 513, the current code word and processing then terminates for the data compression for this tile. If there is more data to process, the processing determines, at step 514, whether the subsequent data byte is zero and processing continues, depending upon that determination, as is described below.

If the data byte that is being processed is determined to be equal to zero, processing advances to determine, at step 506, if the codeword for the current string to be compressed is stored in the COMBINED0 array. As described above, the example embodiment of the present invention initializes all values of the COMBINED0 array to negative one (−1) upon initialization of the dictionary used to determine the compressed output data code words according to the conventional LZW algorithm. Negative one is not a valid LZW output code word and indicates that a valid code word has not been stored in that location of COMBINED0. As code words are calculated for strings that end in zero, the processing, as is described below, stores those code words into the appropriate location of the COMBINED0 array for future recall. The example embodiment of the present invention stores the code words which correspond to data strings that end in zero by indexing entries into the COMBINED0 array according to the LZW code word that corresponds to the string that precedes the "next byte," which has a value of zero. The LZW code word which corresponds to the string preceding the currently processed data byte, which is referred to as the "next byte" in this description, is maintained in the "current_codeword" variable. The processing of the present invention examines the COMBINED0 array location as indexed by the current_codeword variable to determine the COMBINED0 array entry that would correspond to the currently processed data string, which ends with a byte equal to zero due to the previous processing. If the code word for the current string is not stored in the COMBINED0 array, the processing of the example embodiment continues, at step 702 by branching through off-sheet connector 710, with the Calculate COMBINED0 entry processing 700 that is described below.

If the code word for the current string is stored in the COMBINED0 array, processing continues, at step 508, by retrieving the proper code word from the COMBINED0 array and setting the next_codeword variable equal to the retrieved codeword. The value of the current_codeword variable is then set to equal, at step 510, the value of the next_codeword variable that was retrieved from the COMBINED0 array. After setting the current_codeword equal to the next_codeword, the processing continues by checking, at step 512, whether there is more image data within the tile to process. If there is no more image data within the tile to process, the codeword representing the current data string is output, at step 513, and processing for this image tile terminates.

If there is more image data to process, the processing continues by determining, at step 514, if the next data byte is zero. If the next data byte is zero, processing continues, at step 602 by branching through off-sheet connector 620, with the zero string processing flow 600, as is described below. If the subsequent image data byte is not zero, the processing returns to the beginning of the loop, at step 502, where the next image data byte is read and processed as described above.

Figure 6:
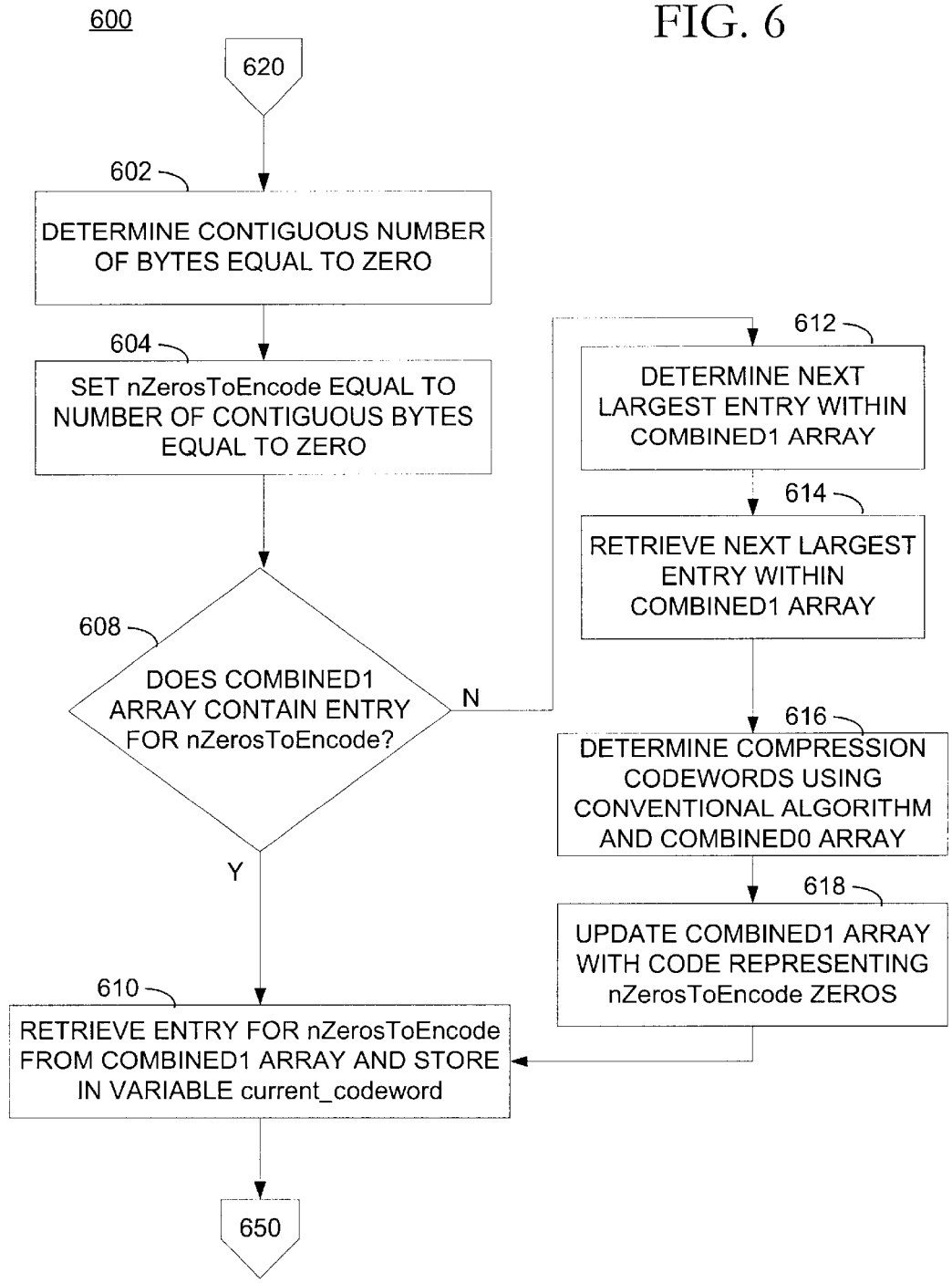

An example zero string processing flow 600 that is performed by the example embodiment of the present invention is illustrated in FIG. 6. This zero string processing flow 600 is performed if the example linework compression processing flow 500 determines that there is a string of multiple image data bytes that are all equal to zero. The example embodiment of the present invention performs this specialized processing in order to take advantage of the observed characteristic that linework data contains a large amount of data bytes that are equal to zero. The example zero string processing flow begins by determining, at step 602, the number of contiguous data bytes which are equal to zero. The example embodiment of the present invention determines image data bytes which are equal to zero by examining the valid bit of the input data stream. Alternative embodiments are able to examine each data byte or use other methods to identify a series of image data bytes which contain no data, i.e., that are equal to zero.

The processing continues by setting, at step 604, the variable nZerosToEncode equal to the number of contiguous image data bytes that are equal to zero. The processing then continues by examining the COMBINED1 array to determine if the code word which represents a string of data bytes that contains a number of zeros equal to the value nZerosToEncode. The processing of the example embodiment initializes each element of the COMBINED1 array to equal negative one (−1) when the LZW encoding tables are initialized. As the processing of the example embodiment determines the code words that correspond to different lengths of data bytes that are all equal to zero, the processing stores those code words into the COMBINED1 array at an element location that is indexed by the number of zeros in the string of zeros. As an example, the COMBINED1 array element number ten contains the compressed output data code word that corresponds to a string of ten zeros in the input data.

If the COMBINED1 array is determined to contain an entry for nZerosToEncode, at step 608, the processing continues by retrieving that code word, at step 610, and setting the current_codeword variable, as is used by the example linework compression processing flow 500 described above to the value of the retrieved code word. The processing then continues, through off-sheet connector 650, with the compression processing flow 500 at step 502.

If the COMBINED1 array does not contain an entry corresponding to the nZerosToEncode value, the processing advances to determine, at step 612, the entry in the COMBINED1 array that corresponds to the largest value of contiguous zeros that does not exceed nZerosToEncode. If there are no code word entries in the COMBINED1 array, this value will be zero and no code word will be retrieved from the COMBINED1 array. If there is an entry in the COMBINED1 array which corresponds to a value less than the value of nZerosToEncode, the example processing flow retrieves, in step 614, the value associated with the largest number of contiguous zero bytes that is less than nZerosToEncode. The retrieved value is used as a starting point to generate an output stream that represents the entire input string of zeros, which comprises nZerosToEncode contiguous bytes equal to zero. The processing continues generating the output data, at step 618, by following conventional LZW processing and using the COMBINED0 array, as is described above in the example linework compression processing flow 500. After a code word is determined that represents a string of nZerosToEncode contiguous bytes that are all equal to zero, that code word is stored, at step 618, in the nZerosToEncode element of the COMBINED1 array for future retrieval. Processing then continues by retrieving that code word, at step 610, and setting the current_codeword variable, as is used by the example linework compression processing flow 500 described above to the value of the retrieved code word. The processing then continues, through off-sheet connector 650, with the compression processing flow 500 at step 502.

Figure 7:
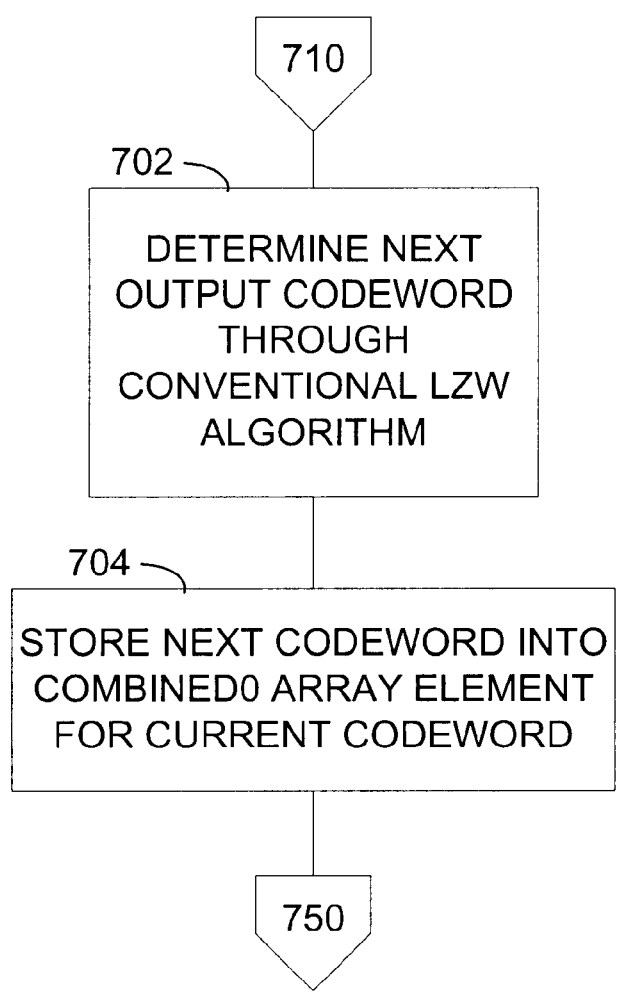

An example Calculate COMBINED0 entry processing flow 700 that is performed by the example embodiment is illustrated in FIG. 7. The COMBINED0 array contains code words for strings that end with a byte equal to zero. Each element of the COMBINED0 array contains a code word that represents a string that consists of a byte that equals zero and that is preceded by a string that is already contained within the conventional LZW hash table (or that comprises a single byte). If the preceding string is already stored in the hash table, it has already been assigned a code word. Single bytes that are not part of a string already stored in the LZW hash table are represented by a code word equal to the value of that byte. The elements of the COMBINED0 array are indexed by the code word of the string that precedes the byte with a value of zero. The element stored in a particular location of the COMBINED0 array is a code word that represents a string comprising the string represented by the code word equal to the COMBINED0 index value followed by a byte with a value equal to zero. Upon entry into the example calculate COMBINED0 entry processing flow 700, the processing calculates, at step 702, the value of the compressed data code word that represents the current string through conventional LZW processing. After computation of that code word value, the processing then stores the calculated code word, at step 704, into the proper location of the COMBINED0 array. Processing then returns to the example linework compression processing flow 500, at step 512, by continuing through off-sheet connector 750.

Generating the 8 bit LZW Compressed Data from Transparency Mask for Two-Tone Data The above LZW processing, which is utilized by the example embodiment, performs special processing for blank areas of an image and allows areas which contain grayscale or colors of various intensities to be printed. The example embodiment of the present invention performs specialized processing of image data, which contains only two tones, i.e., where the pixel is either "on" or "off." If the image data consists of only two tones, this results in the situation where the image pixel data contains only the values 0×00 and 0×ff. The example embodiment comprises a two-tone image detector which analyzes linework images to determine if the linework image contains only two-tone data. The general LZW algorithm of the example embodiment is modified for further efficiency when processing two-tone image data. In the example embodiment, only the image mask data of a two-tone image is processed and not the actual image data. The processing of the example embodiment utilizes the relationship in two-tone linework image data that all of the pixels where mask bit is 1 have the value 0×ff, while all of the pixels where the mask bit is 0 have value of 0×00. If the two-tone image detector determines that the linework image within the current tile is two-tone data, the LZW compression processing of the example embodiment does not utilize a hash table because only two characters are able to occur in the input data. As an alternative to the using hash tables, the processing of the example embodiment utilizes two arrays, the COMBINED0 and the COMBINEDFF arrays. The COMBINED0 array is as is described above for general linework image data compression. The COMBINEDFF array behaves similarly except that lengths of the 0×ff character in the input data stream are encoded through use of the array values instead of conventional LZW processing.

The conventional LZW algorithm encodes a data string that contains all zeros into a compressed datastream containing the value 256 (i.e., start of the image), then the value 0 (the character), then the code 258, then the code 259 and so on. The conventional LZW algorithm skips the code 257 due to that code's special meaning in the LZW algorithm as the image terminator. The character itself is also never repeated, since it has remained constant. Thus, 258 encodes the string 0,0, 259 encodes the string 0,0,0 and so on.

The example embodiment does not detect blank scan lines when encoding two-tone linework image data. Alternative embodiments detect blank scan lines within the two-tone linework image data, but since the two-tone linework image data is not directly read, the difference in processing speed is negligible and size of the software code to perform the processing is decreased.

Hardware and Software Implementation

The present invention can be realized in hardware, software, or a combination of hardware and software. A system according to a preferred embodiment of the present invention can be realized in a centralized fashion in one computer system, or in a distributed fashion where different elements are spread across several interconnected computer systems. Any kind of computer system—or other apparatus adapted for carrying out the methods described herein—is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

Each computer system is able to include, inter alia, one or more computers and at least a computer readable medium allowing a computer to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer medium may include, for example, volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information.

Non-Limiting Examples

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for compressing data, comprising the steps of:
   identifying a data pattern within a dataset, wherein the data pattern ends with at least one pre-defined data value that is determined prior to receipt of the dataset;
   storing a code word that represents the data pattern in at least one alternate data structure, wherein the at least one alternate data structure is separate from a table of code words for data patterns that end in data values excluding the at least one pre-defined data value, and wherein the code word is derived from an algorithm that is identical as that used to derive code words for data patterns that end in data values excluding the at least one pre-defined data value;
   identifying a subsequent occurrence of the data pattern, and
   retrieving the code word from the at least one alternate data structure.

2. The method according to claim 1, wherein one of the at least one pre-defined data value is equal to 0x00.

3. The method according to claim 1, wherein the at least one alternate data structure is a separate data array.

4. The method according to claim 1, wherein the table of code words is a hash table.

5. A method for compressing data, comprising the steps of:
   identifying, within a data set, a data sequence that contains a length of data values that are equal to one of at least one pre-defined data value within the data sequences, wherein the pre-defined data value is defined prior to receipt of the dataset;
   outputting a code word that represents the data sequence, wherein the code word is derived from an algorithm that is identical to that used to derive code words for data patterns ending with data values excluding the at least one pre-defined data value;
   storing the code word in an alternate data structure, wherein the code word is accessed by a value corresponding to the length, and wherein the at least one alternate data structure is separate from a table of code words for data patterns ending with data values excluding the at least one pre-defined data value.

6. The method of claim 5, wherein the one pre-defined data value is 0x00.

7. A system for compressing data, the system comprising:
   a data sequence analyzer for identifying a data pattern within a dataset, wherein the data pattern ends with one of an at least one pre-defined data value that is determined prior to receipt of the dataset;
   a code word data storage for storing, in at least one alternate data structure, a code word corresponding to the data pattern, wherein the at least one alternate data structure is separate from a table of code words for data pattern that end in data values excluding the at least one pre-defined data value, and wherein the code word is derived from an algorithm that is identical as that used to derive code words for data patterns that end in data values excluding the at least one pre-defined data value;
   a code word data producer for determining the code word, wherein the code word producer determines if the code word is stored within the code word data storage, and wherein the code word data producer retrieves the code word if the code word is stored within the code word data storage otherwise the code word producer calculates the code word if the code word is not stored in the code word data storage.

8. The system according to claim 7, wherein one of the at least one pre-defined data value is equal to 0x00.

9. The system according to claim 7, wherein the at least one alternate data structure is a separate data array.

10. The system according to claim 7, wherein the table of code words is a hash table.

11. A system for compressing data, the system comprising:
    a data sequence analyzer for, within a data set, a data sequence that contains a length of data values that are equal to a pre-defined data value within the data sequence;
    outputting a code word that represents the data sequence, wherein the code word is derived from an algorithm that is identical to that used to derive code words for data patterns ending with data values excluding the at least one pre-defined data value;
    a code word data storage for storing, in at least one alternate data structure, the code word corresponding to the data sequence, wherein the code word is accessed by a value corresponding to the length, and wherein the at least one alternate data structure is separate from a table of code words for data patterns ending with data values excluding the at least one pre-defined data value.

12. The system of claim 11, wherein the one pre-defined data value is 0x00.

13. A computer readable medium including computer instructions for compressing data, the computer instructions comprising instructions for:

identifying a data pattern within a dataset, wherein the data pattern ends with at least one pre-defined data value that is determined prior to receipt of the dataset;

storing a code word that represents the data pattern in at least one alternate data structure, wherein the at least one alternate data structure is separate from a table of code words for data patterns that end in data values excluding the at least one pre-defined data value, and wherein the code word is derived from an algorithm that is identical as that used to derive code words for data patterns that end in data values excluding the at least one pre-defined data value;

identifying a subsequent occurrence of the data pattern, and retrieving the code word from the at least one alternate data structure.

14. The computer readable medium according to claim 13, wherein one of the at least one pre-defined data value is equal to 0x00.

15. The computer readable medium according to claim 13, wherein the at least one alternate data structure is a separate data array.

16. The computer readable medium according to claim 13, wherein the table of code words is a hash table.

17. A computer readable medium including computer instructions for compressing data, the computer instructions comprising instructions for:

identifying, within a data set, a data sequence that contains a length of data values that are equal to a pre-defined data value within the data sequence;

outputting a code word that represents the data sequence, wherein the code word is derived from an algorithm that is identical to that used to derive code words for data patterns ending with data values excluding the at least one pre-defined data value;

storing the code word in an alternate data structure, wherein the code word is accessed by a value corresponding to the length, and wherein the at least one alternate data structure is separate from a table of code words for data patterns ending with data values excluding the at least one pre-defined data value.

18. The computer readable medium according to claim 17, wherein the one pre-defined data value is 0x00.

* * * * *